(12) United States Patent
Shiraishi et al.

(10) Patent No.: US 10,847,232 B2
(45) Date of Patent: Nov. 24, 2020

(54) SEMICONDUCTOR MEMORY DEVICE

(71) Applicant: TOSHIBA MEMORY CORPORATION, Tokyo (JP)

(72) Inventors: Kei Shiraishi, Kawasaki Kanagawa (JP); Masaru Koyanagi, Ota Tokyo (JP); Mikihiko Ito, Ota Tokyo (JP); Yumi Takada, Yokohama Kanagawa (JP); Yasuhiro Hirashima, Kawasaki Kanagawa (JP); Satoshi Inoue, Zushi Kanagawa (JP); Kensuke Yamamoto, Yokohama Kanagawa (JP); Shouichi Ozaki, Komae Tokyo (JP); Taichi Wakui, Kawasaki Kanagawa (JP); Fumiya Watanabe, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/555,993

(22) Filed: Aug. 29, 2019

(65) Prior Publication Data

US 2020/0202959 A1   Jun. 25, 2020

(30) Foreign Application Priority Data

Dec. 21, 2018   (JP) .................................. 2018-240031

(51) Int. Cl.
  *G11C 7/10*   (2006.01)
  *G11C 16/32*   (2006.01)
  (Continued)

(52) U.S. Cl.
  CPC .......... *G11C 16/32* (2013.01); *G11C 16/0483* (2013.01); *H03F 3/45264* (2013.01); *H03F 3/45269* (2013.01)

(58) Field of Classification Search
  CPC . G11C 16/32; G11C 16/0483; H03F 3/45264; H03F 3/45269
  (Continued)

(56) References Cited

U.S. PATENT DOCUMENTS 6,617,885 B2   9/2003   Lim et al.
8,065,553 B2   11/2011   Tamura et al.
(Continued)

FOREIGN PATENT DOCUMENTS

JP   2014187419 A   10/2014
TW   200938984 A   9/2009

*Primary Examiner* — Xiaochun L Chen
(74) *Attorney, Agent, or Firm* — Kim & Stewart LLP

(57) ABSTRACT

A semiconductor memory device includes a differential waveform shaping circuit including first and waveform shaping circuits connected in parallel. The first waveform shaping circuit has a first inverting amplifier, and two inverters connected in series. The first inverting amplifier inverts and differentially amplifies an input signal having a rectangular waveform. Then, the output of the first inverting amplifier is passed through the two inverters. The second waveform shaping circuit has a first inverter, a second inverting amplifier, and a second inverter connected in series. The second inverting amplifier inverts and differentially amplifies the output signal from the first invertor, and the second inverter inverts the output signal from the second inverting amplifier. The differential waveform shaping circuit generates an output signal by averaging the output signal from the first waveform shaping circuit and the output signal from the second waveform shaping circuit.

20 Claims, 11 Drawing Sheets

(51) Int. Cl.
*H03F 3/45* (2006.01)
*G11C 16/04* (2006.01)

(58) Field of Classification Search
USPC .................................................. 365/185.18
See application file for complete search history.

(56) References Cited

U.S. PATENT DOCUMENTS 9,214,217 B2 * 12/2015 Ikehata ............... G11C 11/4096
2005/0275461 A1    12/2005 Heightley et al.
2014/0285247 A1     9/2014 Ito et al.
2016/0071572 A1     3/2016 Ikehata et al.

* cited by examiner

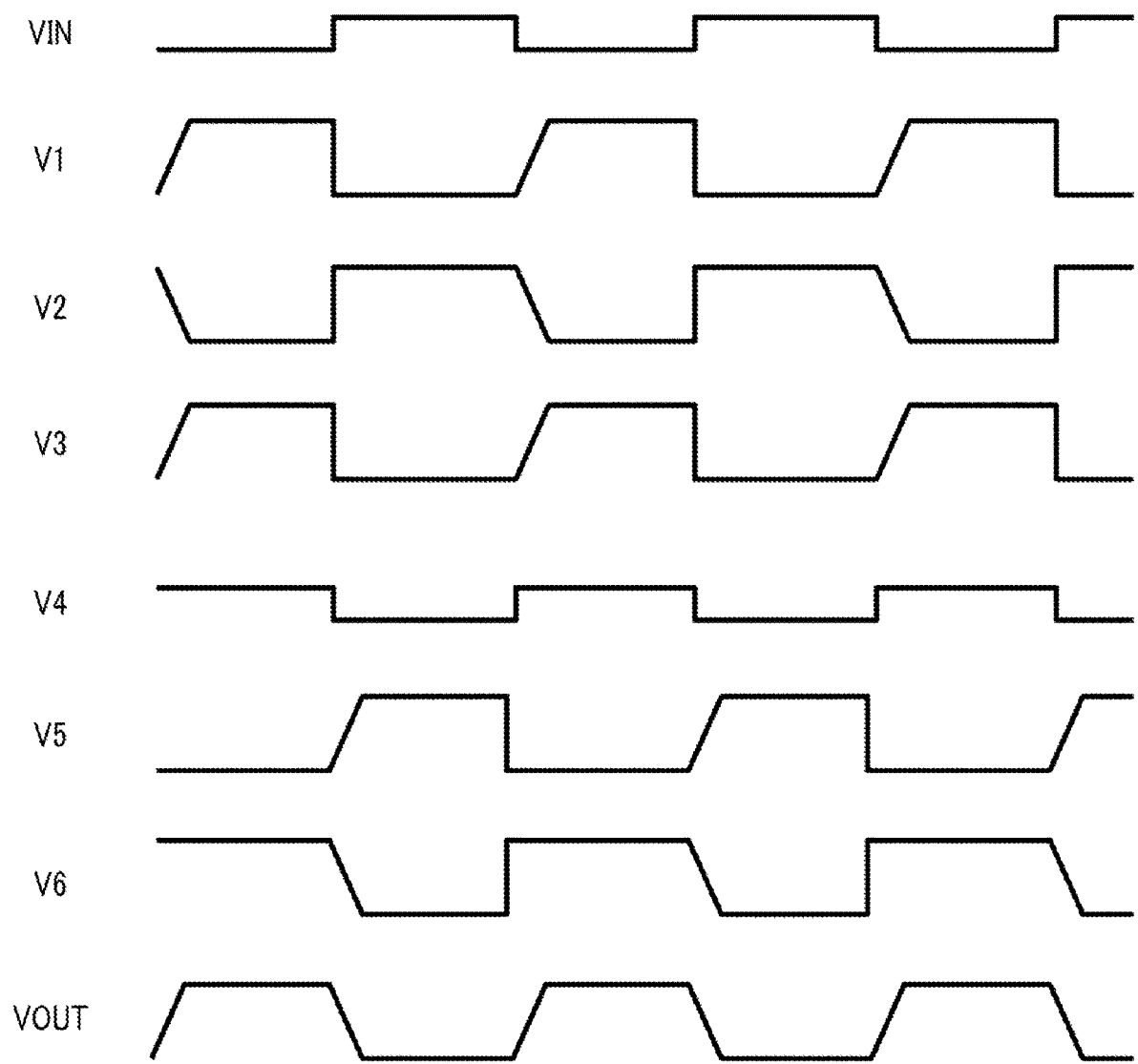

SEMICONDUCTOR MEMORY DEVICE

CROSS-REFERENCE TO RELATED APPLICATION

This application is based upon and claims the benefit of priority from Japanese Patent Application No. 2018-240031, filed Dec. 21, 2018, the entire contents of which are incorporated herein by reference.

FIELD

Embodiments described herein relate generally to a semiconductor memory device.

BACKGROUND

A NAND flash memory is known as a semiconductor memory device.

DESCRIPTION OF THE DRAWINGS

FIG. 4 illustrates various waveforms that are shaped in the differential waveform shaping circuit shown in FIG. 1B.

DETAILED DESCRIPTION

Figure 1A:
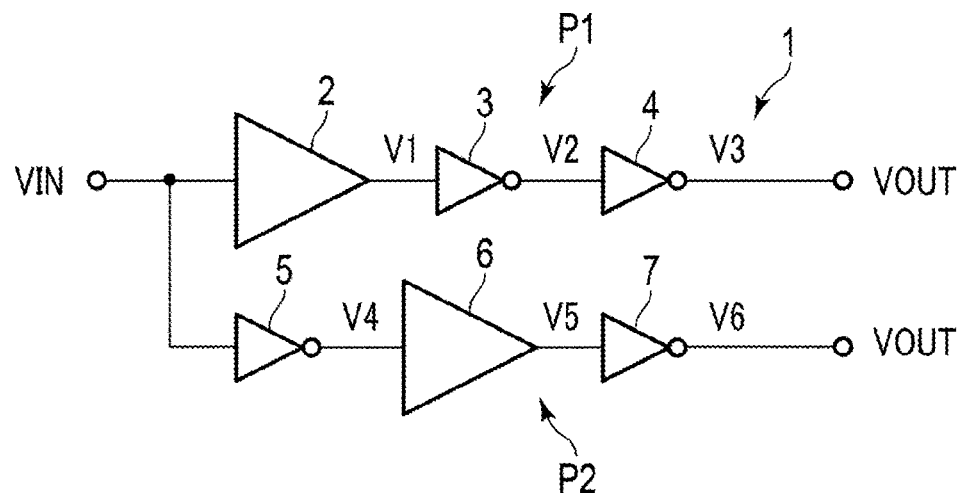
FIG. 1A is a simplified circuit diagram of a differential waveform shaping circuit according to a comparative example.

Embodiments provide a semiconductor memory device with improved reliability.

In general, according to one embodiment, a semiconductor memory device includes a differential waveform shaping circuit having a first waveform shaping circuit and a second waveform shaping circuit. The first waveform shaping circuit has a first inverting amplifier, a first inverter, and a second inverter connected in series, wherein the first inverting amplifier is configured to invert and differentially amplify an input signal having a rectangular waveform, the first inverter is configured to invert a phase of a first signal output from the first amplifier, and the second inverter is configured to invert a second signal output from the first inverter and output the inverted second signal. The second waveform shaping circuit has a third inverter, a second inverting amplifier, and a fourth inverter connected in series, wherein the third inverter is configured to invert a phase of the input signal, the second inverting amplifier is configured to invert and differentially amplify a third signal output from the third inverter, and the fourth inverter is configured to invert the phase of a fourth signal output from the second amplifier and output the inverted fourth signal. The first waveform shaping circuit and the second waveform shaping circuit are connected in parallel, and the differential waveform shaping circuit is configured to generate an output signal by averaging the inverted second signal output by the first waveform shaping circuit and the inverted fourth signal output by the second waveform shaping circuit. By averaging the inverted second signal output by the first waveform shaping circuit and the inverted fourth signal output by the second waveform shaping circuit, a slope of a waveform generated due to delayed rising of a waveform at the time of amplification by the first inverting amplifier, and a slope of a waveform generated due to delayed falling of a waveform at the time of amplification by the second inverting amplifier have substantially the same magnitudes.

Hereinafter, embodiments will be described with reference to the drawings. In the following description, components having the same function and configuration are denoted by the same reference numerals, and the detailed description thereof is not repeated.

The differential waveform shaping circuit of the present embodiment is provided in an output data amplifier (DOUTAMP) in an output circuit of a NAND flash memory, which is a type of semiconductor memory device. According to the differential waveform shaping circuit of the present embodiment, it is possible to reduce the difference between a time period of an H (High) level and a time period of an L (Low) level of the output signal, to enable the NAND flash memory to operate at an increased data rate, and to reduce data pattern dependent jitter at a high speed operation.

Figure 2:
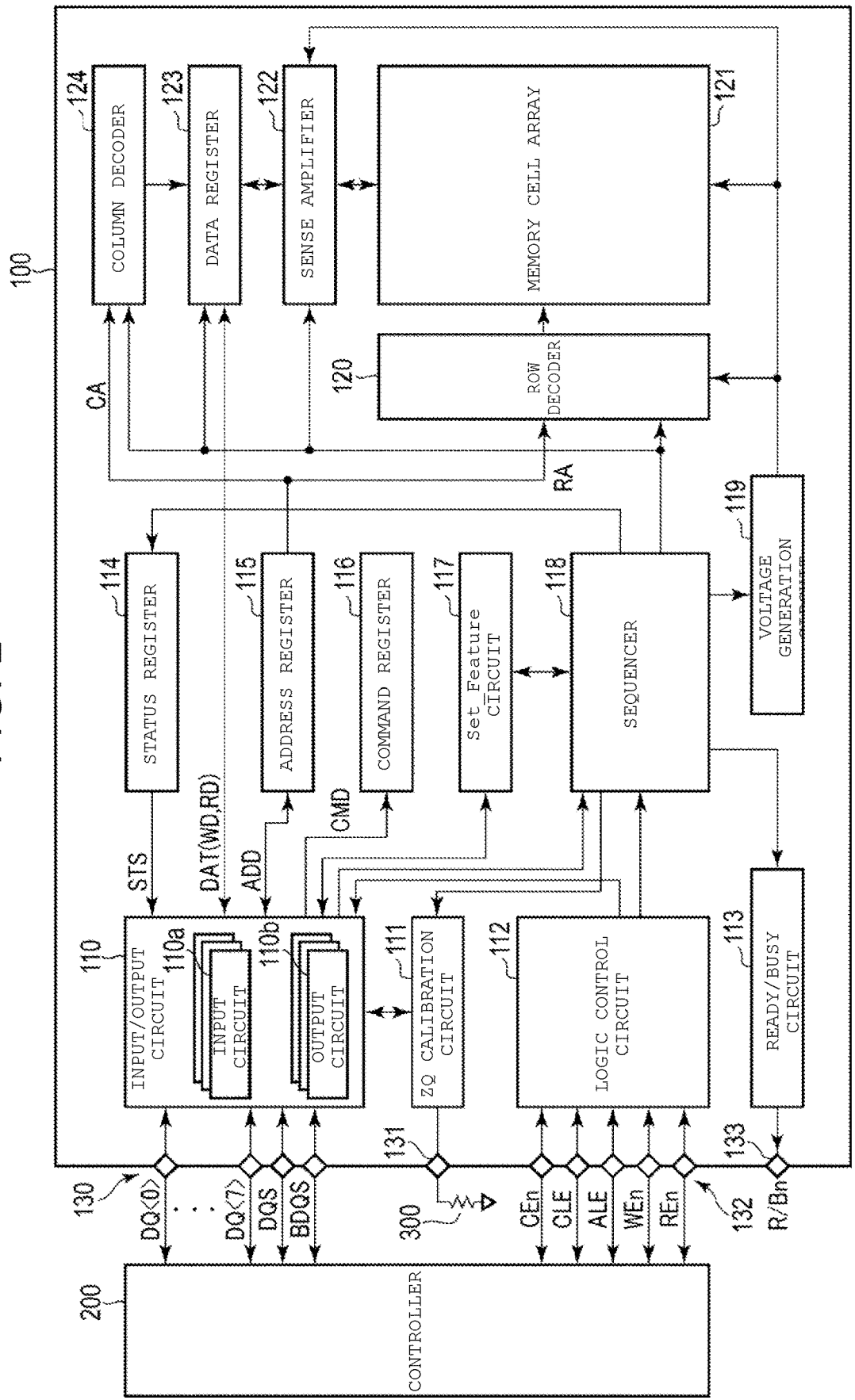
FIG. 2 is a block diagram of a NAND flash memory.

First, a NAND flash memory 100 will be described with reference to FIG. 2. This NAND flash memory 100 includes an input/output circuit 110, a ZQ calibration circuit 111, a logic control circuit 112, a ready/busy circuit 113, a status register 114, an address register 115, a command register 116, a Set Feature circuit 117, a sequencer 118, a voltage generation circuit 119, a row decoder 120, a memory cell array 121, a sense amplifier 122, a data register 123, a column decoder 124, an input/output pad group 130, a ZQ pad 131, an input pad group 132, and an RB pad 133.

The NAND flash memory 100 operates based on an instruction from a controller 200 connected by a bus. Specifically, the NAND flash memory 100 transmits and receives, for example, 8-bit signals DQ<0> to DQ<7> (however, the signals are not limited to DQ<0> to DQ<7>) to and from the controller 200.

The NAND flash memory 100 also transmits and receives clock signals DQS and BDQS (inverted signal of a signal DQS) to and from the controller 200. The signal DQS and the signal BDQS, for example, control the timing of transmission and reception of signals DQ<7:0>. In addition, the NAND flash memory 100 receives, for example, a chip enable signal CEn, a command latch enable signal CLE, an address latch enable signal ALE, a write enable signal WEn, and a read enable signal REn from the controller 200. In addition, the NAND flash memory 100 transmits a ready/busy signal R/Bn to the controller 200.

The chip enable signal CEn is a signal for enabling the NAND flash memory 100, and is asserted at, for example, a low ("L") level. The command latch enable signal CLE is a signal indicating that the signal DQ is a command and is asserted at, for example, a high ("H") level. The address latch enable signal ALE is a signal indicating that the signal DQ is an address and is asserted at, for example, the "H" level.

The write enable signal WEn is a signal that is asserted at, for example, the "L" level each time a command, an address, data, and the like are received from the controller 200. Thus, the signal DQ is received into the NAND flash memory 100 each time the write enable signal WEn is toggled.

The read enable signal REn is a signal that is asserted, for example, at the "L" level, and indicates to the NAND flash memory 100 to output the signal DQ to the controller 200 based on the toggled read enable signal REn. The ready/busy signal R/Bn is a signal indicating whether the NAND flash memory 100 is in a busy state or in a ready state (whether or not a command may or may not be received from controller 200), and for example, is set to the "L" level when the NAND flash memory 100 is in the busy state.

The input/output circuit 110 transmits and receives the signals DQ<7:0>, the signal DQS, and the signal BDQS to and from the controller 200. Alternatively, the input/output circuit 110 may receive the signals DQS and BDQS from controller 200 via the logic control circuit 112. The input/output circuit 110 transmits a command CMD in the signals DQ<7:0> to the command register 116. The input/output circuit 110 transmits and receives an address ADD to and from the address register 115, and transmits and receives data to and from the data register 123. The input/output circuit 110 transmits parameter settings of various operations received from the controller 200 to the Set_Feature circuit 117 and receives parameter information, such as the setting value (for example, any setting value of 25 Ω, 35 Ω, or 50 Ω) of the output impedance (hereinafter, referred to as "Ron setting value information") from the Set_Feature circuit 117.

The input/output circuit 110 also includes a plurality of input circuits 110a and a plurality of output circuits 110b corresponding to a plurality of signals. For example, a set including one input circuit 110a and one output circuit 110b is connected to one pad in the input/output pad group 130 and is used to transmit and receive any one bit of the signals DQ<7:0>, the signal DQS, or the signal BDQS. Hereinafter, the input circuit 110a and the output circuit 110b corresponding to a signal DQ<k> (k is an integer of 0≤k<7) are referred to as an input circuit 110a<k> and an output circuit 110b<k>.

Further, the input circuit 110a and the output circuit 110b corresponding to the signal DQS are referred to as an input circuit 110a_DQS and an output circuit 110b_DQS, and the input circuit 110a and the output circuit 110b corresponding to the signal BDQS are referred to as an input circuit 110a_BDQS and an output circuit 110b_BDQS. Details of the output circuit 110b will be described later.

The input/output pad group 130 includes output pad groups 130<7:0>, a 130_DQS, and a 130_BDQS corresponding to the signals DQ<7:0>, the signal DQS, and the signal BDQS. The input/output pad group 130 connects the input/output circuit 110 and a NAND bus. Each pad in the input/output pad group 130 is recognized from outside the NAND flash memory 100 as one output terminal having an output impedance.

The ZQ calibration circuit 111 is connected to a reference resistor 300 via the ZQ pad 131. The ZQ calibration circuit 111 has a function of performing a ZQ calibration operation of calibrating the output impedance of the NAND flash memory 100 based on the reference resistor 300 according to the instruction of the sequencer 118. For example, the ZQ calibration circuit 111 measures the output impedance at an upper limit temperature and a lower limit temperature of the operating environment temperature of the NAND flash memory 100 to acquire performance information on a transistor in an operation amplification circuit of a DOUT amplifier described later. The calibration result of the ZQ calibration circuit 111 (hereinafter, referred to as "ZQ information") is transmitted to, for example, the output circuit 110b.

One end of the ZQ pad 131 is connected to the reference resistor 300, and the other end is connected to the ZQ calibration circuit 111. The ZQ pad 131 is recognized from outside the NAND flash memory 100 as one output terminal having an output impedance.

The logic control circuit 112 receives the signals CEn, CLE, ALE, WEn, and REn from controller 200 via the input pad group 132. The logic control circuit 112 controls the input/output circuit 110 and the sequencer 118 in response to the received signal. The input pad group 132 includes a plurality of pads corresponding to the signals CEn, CLE, ALE, WEn, and REn and connects the logic control circuit 112 to the NAND bus.

The ready/busy circuit 113 is connected to the RB pad 133. The ready/busy circuit 113 transmits the ready/busy signal R/Bn to the controller 200 according to the operation status of the sequencer 118. Alternatively, the ready/busy circuit 113 may include the output circuit 110b.

The RB pad 133 connects the ready/busy circuit 113 and the NAND bus. The status register 114 temporarily holds status information STS for, for example, data write, read, and erasing operations, and notifies the controller 200 whether or not the operations has ended normally.

The address register 115 temporarily holds the address ADD received from the controller 200 via the input/output circuit 110. Then, the address register 115 transfers a row address RA to the row decoder 120 and transfers a column address CA to the column decoder 124. The command register 116 temporarily stores the command CMD received from the controller 200 via the input/output circuit 110 and transfers the command CMD to the sequencer 118.

The Set_Feature circuit 117 stores parameter settings of various operations received from the controller 200 and sets parameters for various operations. For example, when the NAND flash memory 100 is turned on (when the power is turned on), the sequencer 118 performs an operation (hereinafter, referred to as "POR (power on read)") of reading a parameter from the Set_Feature circuit 117. Alternatively, the Set_Feature circuit 117 may be provided in the sequencer 118, and parameter settings may be stored in the memory cell array 121.

The sequencer 118 controls the overall operation of the NAND flash memory 100. More specifically, the sequencer 118 controls, for example, the input/output circuit 110, the ZQ calibration circuit 111, the ready/busy circuit 113, the status register 114, the Set_Feature circuit 117, the voltage generation circuit 119, the row decoder 120, the sense amplifier 122, the data register 123, and the column decoder 124 in response to the command CMD held by the command register 116 to execute a write operation, a read operation, or an erasing operation.

The voltage generation circuit 119 generates voltages necessary for the write operation, the read operation, and the erasing operation depending on the control of sequencer 118 to supply the generated voltages to, for example, the memory cell array 121, the row decoder 120, and the sense amplifier 122, and the like. The row decoder 120 and the sense amplifier 122 apply the voltage supplied from the voltage generation circuit 119 to the memory cell transistors in the memory cell array 121.

The memory cell array 121 includes a plurality of non-volatile memory cell transistors (also referred to as "memory cells") associated with rows and columns. In the memory cell array 121, information relating to the on-resistance Ron of the transistor measured in a test process before product shipment (hereinafter, referred to as "Ron information") is stored in a non-volatile manner. The Ron information includes information for adjusting the output impedance, e.g., the setting value to which the output impedance is to be adjusted. Based on the Ron information, the size of transistors in a pre-driver circuit and an output buffer in the output circuit 110b is determined.

More specifically, in the pre-driver circuit and the output buffer, for example, a plurality of transistors having different on-resistances Ron depending on the difference in the transistor size (more particularly, gate width) are connected in parallel. Then, one or more transistors are selected based on Ron information, whereby the on-resistance Ron of the composite transistor by selected transistors can be optimized, and the output impedance can be matched to the setting value. For example, in a case where an inverting differential amplifier circuit and an inverter include transistors having different on-resistance Ron in a DOUT amplifier 144, the composite on-resistance Ron can be selected from a plurality of different combinations depending on the number of transistors. In this case, the Ron information is indicated by a multi-bit digital signal. For example, in a case where eight transistors are connected in parallel, the on-resistance Ron of the composite transistor can be selected from 256 ($=2^8$) combinations. There may be any number of transistors to be used to adjust the on-resistance Ron. For example, the Ron information is calculated from the result of measuring an on-resistance Ronp of a p-channel MOSFET (hereinafter, referred to as "PMOS transistor") and an on-resistance Ronn of an n-channel MOSFET (hereafter, referred to as "NMOS transistor") in the test process.

The row decoder 120 decodes the row address RA. The row decoder 120 applies a necessary voltage to the selected memory cell transistor based on the decoding result. The sense amplifier 122 senses the data read from the memory cell array 121 in the read operation. Then, the sense amplifier 122 transmits read data RD to the data register 123. Further, the sense amplifier 122 transmits write data WD to the memory cell array 121 during the write operation.

The data register 123 includes a plurality of latch circuits. The latch circuit stores the write data WD and the read data RD. For example, in the write operation, the data register 123 temporarily stores the write data WD received from the input/output circuit 110 and transmits the write data WD to the sense amplifier 122. Further, for example, in the read operation, the data register 123 temporarily stores the read data RD received from the sense amplifier 122 and transmits the read data RD to the input/output circuit 110.

The column decoder 124 decodes the column address CA, for example, during the write operation, the read operation, and the erasing operation and selects the latch circuit in the data register 123 according to the decoding result.

Next, the configuration of the output circuit 110b will be described with reference to FIG. 3. In the example shown in FIG. 3, an output circuit 110b<0> corresponding to the input/output pad 130<0> of the signal DQ<0> will be described, but the other output circuits 110b<k>, 110b_DQS, and 110b_BDQS have the same configuration. Furthermore, in this example, the case where Ron information is stored in the memory cell array 121 will be described, but the Ron information may be stored in a fuse region of the NAND flash memory 100. Furthermore, although the example shown in FIG. 3 describes the case where the ZQ information is calibrated, the ZQ calibration circuit 111 and the ZQ information may be omitted.

Figure 3:
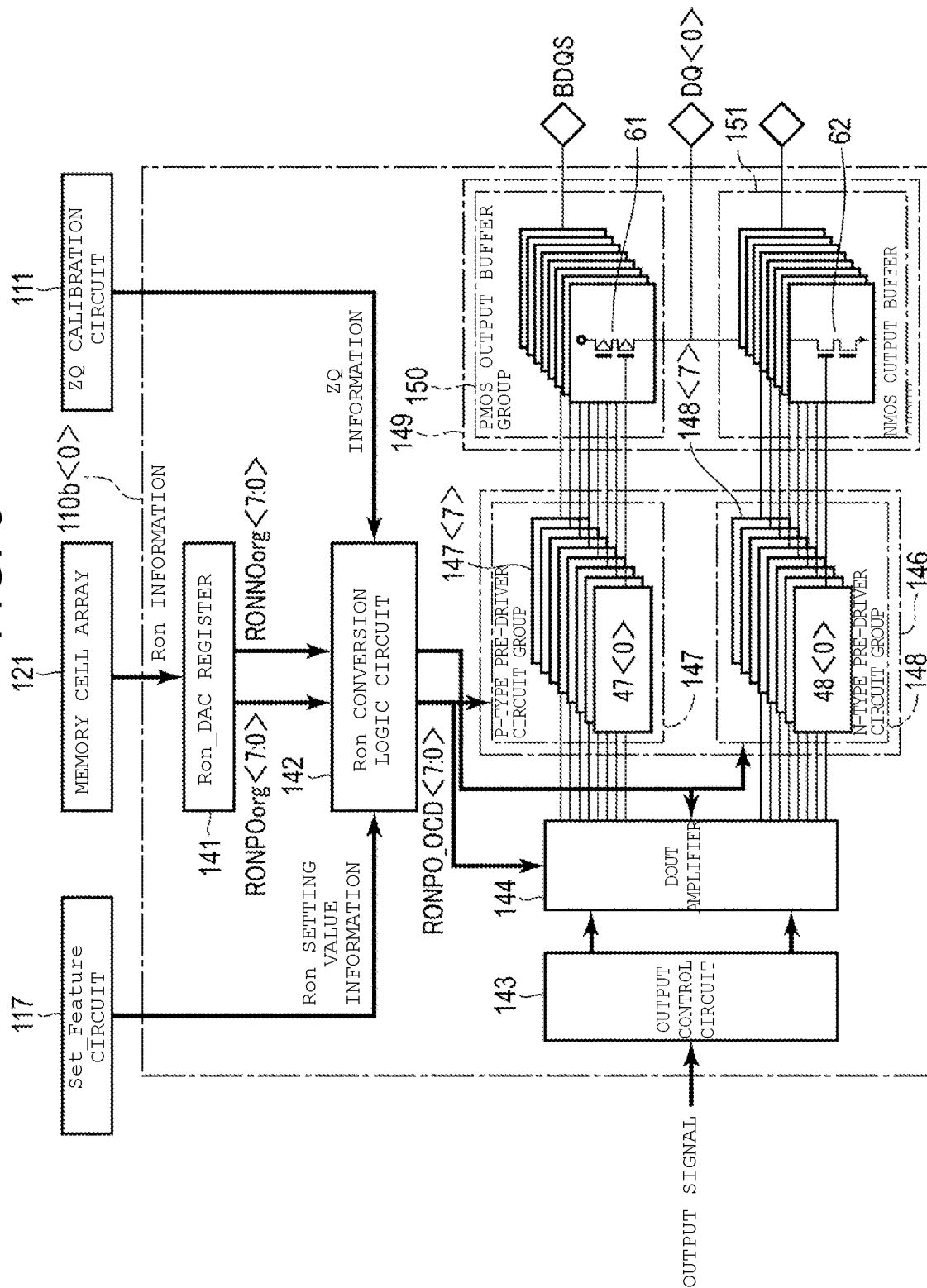
FIG. 3 is a block diagram of an output circuit of the NAND flash memory.

As shown in FIG. 3, an output circuit 110b<0> includes a Ron_DAC register 141, a Ron conversion logic circuit 142, an output control circuit 143, the DOUT amplifier 144, a pre-driver circuit 146, and an output buffer 149.

The Ron_DAC register 141 is a register for temporarily storing the Ron information stored in the memory cell array 121. The sequencer 118 stores the Ron information in the Ron_DAC register 141 as one of POR operations after the power of the NAND flash memory 100 is turned on. More specifically, in the Ron_DAC register 141, 8-bit signals RONPOorg<7:0> related to the transistor size of the transistor (hereinafter, referred to as "output transistor") of a PMOS output buffer 150 described later and 8-bit signals RONNOorg<7:0> related to the transistor size of the output transistor of an NMOS output buffer 151 described later are stored as Ron information. The signals RONPOorg<7:0> stored in the Ron_DAC register 141 are sent to the Ron conversion logic circuit 142. Further, the signals RONNOorg<7:0> stored in the Ron_DAC register 141 is transmitted to the Ron conversion logic circuit 142.

Based on Ron setting value information received from the Set_Feature circuit 117 and ZQ information on the PMOS transistor received from the ZQ calibration circuit 111, the Ron conversion logic circuit 142 converts the signals RONPOorg<7:0> received from the Ron_DAC register 141 to generate signals RONPO_OCD<7:0> and transmit the generated signals RONPO_OCD<7:0> to the DOUT amplifier 144 and a P-type pre-driver circuit group 147. Similarly, based on Ron setting value information received from the Set_Feature circuit 117 and ZQ information on the NMOS transistor received from the ZQ calibration circuit 111, the Ron conversion logic circuit 142 converts the signals RONNOorg<7:0> received from the Ron_DAC register 141 to generate signals RONNO_OCD<7:0> and transmit the generated signals RONNO_OCD<7:0> to the DOUT amplifier 144 and an N-type pre-driver circuit group 148.

The output control circuit 143 transmits an output signal received from another circuit (for example, the data register 123 or the like) in the NAND flash memory 100 to the DOUT amplifier 144. The pre-driver circuit 146 sends a voltage based on the output signal to the output buffer 149. The pre-driver circuit 146 includes the P-type pre-driver circuit group 147 and the N-type pre-driver circuit group 148.

The P-type pre-driver circuit group 147 outputs an inverted signal of the output signal to the PMOS output buffer group 150. The P type pre-driver circuit group 147 includes eight P-type pre-driver circuits 147<0> to 147<7> corresponding to respective bits of signals RONPO_OCD<7:0>. The P-type pre-driver circuits 147<0> to 147<7> have the same configuration. Hereinafter, the P-type pre-driver circuit corresponding to a signal RONPO_OCD<m> (m is an integer of 0≤m<7) is referred to as a P-type pre-driver circuit 147<m>. The P-type pre-driver circuit 147<m> receives the signal RONNOorg<7: 0> not including the Ron setting value information and the ZQ information from the Ron_DAC register 141, and based on the signal RONNOorg<7:0>, the transistor size of the NMOS transistor in the P-type pre-driver circuit 147<m> can be changed. The configuration of the P-type pre-driver circuit 147<m> will be described later.

The N-type pre-driver circuit group 148 outputs an inverted signal of the output signal to the NMOS output buffer group 151. The N-type pre-driver circuit group 148 includes eight N-type pre-driver circuits 148<0> to 148<7> corresponding to respective bits of the signal RONNO_OCD<7:0>. The N-type pre-driver circuits 148<0> to 148<7> have the same configuration. Hereinafter, the N-type pre-driver circuit 148 corresponding to the signal RONNO_OCD<m> (m is an integer of 0≤m<7) is referred to as an N-type pre-driver circuit 148<m>. The N-type pre-driver circuit 148<m> receives the signal RONPOorg<7:0> not including the Ron setting value information and the ZQ information from the Ron_DAC register 141, and based on the signal RONPOorg<7:0>, the transistor size of the PMOS transistor in the N-type pre-driver circuit 148<m> can be changed.

The output buffer 149 converts the output signal to an appropriate voltage level and then outputs the signal to the controller 200 via a pad 30<0>. The output buffer 149 includes the PMOS output buffer group 150 and the NMOS output buffer group 151.

When the output signal of the P-type pre-driver circuit group 147 is at the "L" level, the PMOS output buffer group 150 applies a power supply voltage VCCQ at the "H" level to the pad 30<0>. The PMOS output buffer group 150 includes eight PMOS output buffers 150<0> to 150<7> connected to the eight P-type pre-drivers 147<0> to 147<7>, respectively. Hereinafter, the PMOS output buffer corresponding to the P-type pre-driver 147<m> is described as a PMOS output buffer 150<m>.

The PMOS output buffers 150<0> to 150<7> include PMOS transistors 61<0> to 61<7>, respectively. Hereinafter, a PMOS transistor corresponding to the PMOS output buffer 150<m> is referred to as a PMOS transistor 61<m>. The gate of the transistor 61<m> is connected to the corresponding P-type pre-driver circuit 147<m>, the voltage VCCQ is applied to the source, and the drain is connected to the pad 30<0>.

The eight transistors 61<0> to 61<7> have different on-resistance Ronp). For example, the on-resistance Ronp of the transistors 61<0> to 61<7> has a relationship of (61<0>)<(61<1>)< . . . <(61<7>). Then, by combining the transistors 61<0> to 61<7>, the composite on-resistance Ronp of the PMOS transistor 61 in the PMOS output buffer group 150 can be one of $2^8=256$ combinations. That is, based on the signals RONPO_OCD<7:0>, the output impedance of the PMOS transistor can be selected from 256 combinations.

When the output signal of the N-type pre-driver circuit group 148 is at the "H" level, the NMOS output buffer group 151 applies a voltage (ground voltage VSS) at the "L" level to the pad 30<0>. The NMOS output buffer group 151 includes eight NMOS output buffers 151<0> to 151<7> connected to the eight N-type pre-drivers 148<0> to 148<7>, respectively. Hereinafter, the NMOS output buffer corresponding to the N-type pre-driver 148<m> is referred to as an NMOS output buffer 151<m>.

The NMOS output buffers 151<0> to 151<7> include NOS transistors 62<0> to 62<7>, respectively. Hereinafter, an NMOS transistor corresponding to the NMOS output buffer 151<m> is described as an NMOS transistor 62<m>. The gate of the transistor 62<m> is connected to the corresponding N-type pre-driver circuit 148<m>, the source is grounded (the voltage VSS is applied), and the drain is connected to the pad 30<0>.

The eight NMOS transistors 62<0> to 62<7> have different on-resistance Ronn). For example, the on-resistance Ronn of the NMOS transistors 62<0> to 62<7> has a relationship of (62<0>)<(62<1>)< . . . <(62<7>). Then, by combining the NMOS transistors 62<0> to 62<7>, the composite on-resistance Ronn) of the NMOS transistor 62 in the NMOS output buffer group 151 can be one of $2^8=256$ combinations. That is, based on the signals RONNO_OCD<7: 0>, the output impedance of the NMOS transistor 62 can be selected from 256 combinations.

Figure 7A:
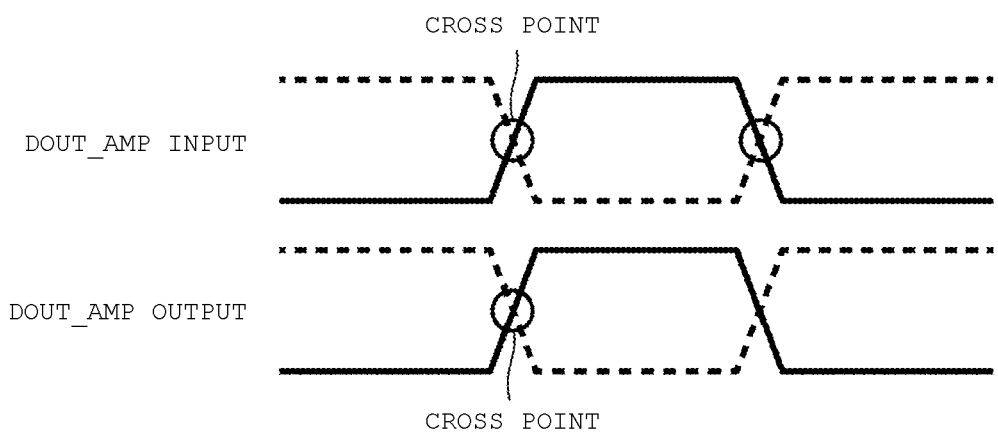
FIGS. 7A-7C illustrates waveforms of an input signal and an output signal in the differential waveform shaping circuit.
Figure 7B:
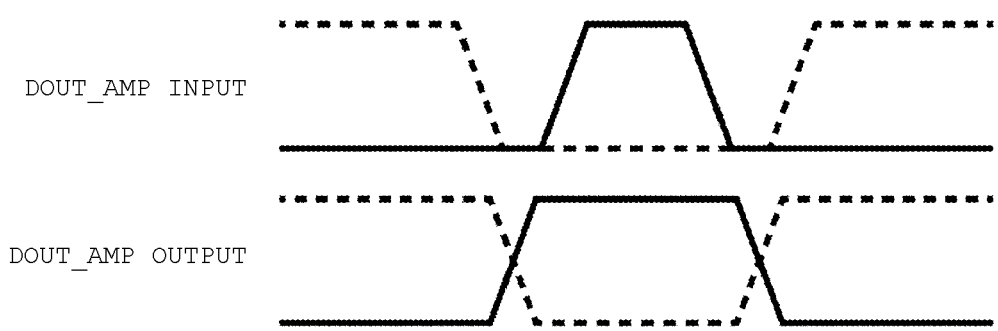
Figure 7C:
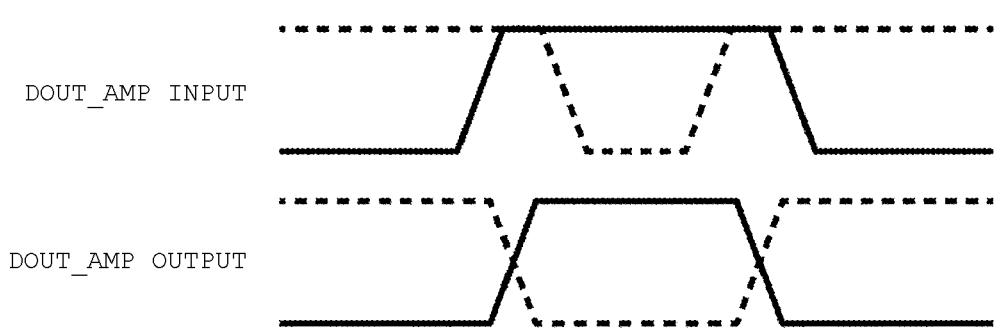

A configuration example of the differential waveform shaping circuit to be used for the DOUT amplifier according to the first embodiment will be described with reference to FIGS. 1A, 1B, 4, 5A, and 5B. The differential waveform shaping circuit 1 of the present embodiment forms a waveform so that the input signal forms a proper crossing point (or more simply referred to as cross point) by using two cross-coupled load amplifiers connected in parallel and a plurality of phase inverting circuits (or more simply referred to as inverters) connected to each cross-coupled load amplifier. For example, FIG. 7A shows a signal having no H-L difference in the input signal, but as shown in FIGS. 7B and 7C, even if there is an H-L difference between the H level and the L level in an input signal, both output signals are corrected for the H-L difference to reduce data pattern dependent jitter at the high speed operation.

Figure 1B:
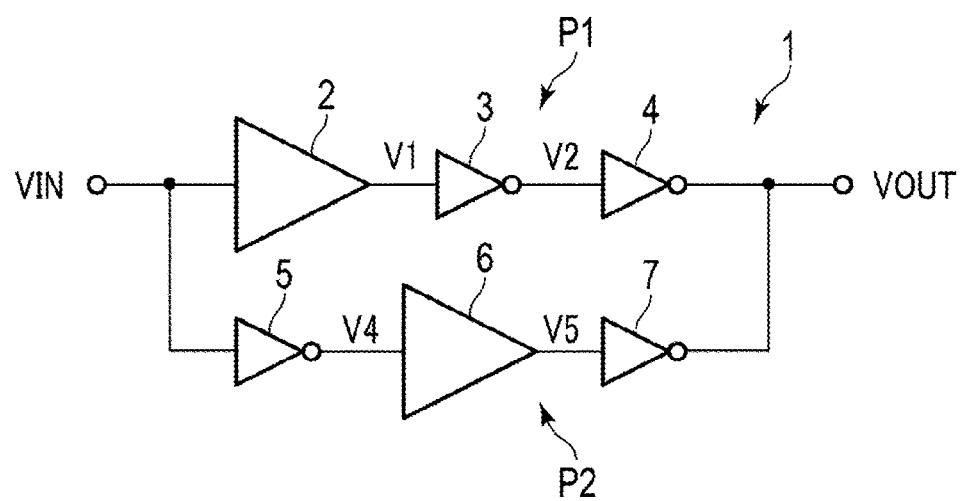
FIG. 1B is a simplified circuit diagram of a differential waveform shaping circuit according to a first embodiment.

The differential waveform shaping circuit 1 includes a first waveform shaping circuit P1 in a first current path and a second waveform shaping circuit P2 in a second current path, which are disposed in parallel. The first current path and the second current path are branched from one input end, disposed in parallel, and coupled to one output end. Specifically, as shown in FIG. 1A, in the first waveform shaping circuit P1, a first amplifier 2, a first inverter 3, and a second inverter 4 are connected in series in this order from the input end to output a signal V3. Similarly, in the second waveform shaping circuit P2, a third inverter 5, a second amplifier 6, and a fourth inverter 7 are connected in series in this order from the input end to output a signal V6. In addition, as shown in FIG. 1B, each output side of the second inverter 4 and the fourth inverter is connected to the output end. Further, the first amplifier 2 and the second amplifier 6 have the same characteristics (for example, input/output characteristics, temperature characteristics, and the like). Further, at least the second inverter 4 and the fourth inverter 7 have the same size, are formed according to the same manufacturing parameters, and have the same input/output characteristics. For example, an inverting differential amplifier circuit is used as the first amplifier 2 and the second amplifier 6. The differential waveform shaping circuit 1 to be used in the present embodiment has the circuit configuration shown in FIG. 1B, and the circuit configuration shown in FIG. 1A is described so that the waveform formation shown in FIG. 4 can be easily understood.

Next, with reference to FIG. 4, waveform shaping by the output signal of each component in the differential waveform shaping circuit 1 will be described. First, an input signal is a rectangular wave having a fixed period, for example, an input signal VIN having a pulse waveform. When the input signal VIN is input to the first waveform shaping circuit Pl, the first amplifier 2 performs reverse differential amplification on the input signal VIN to output a signal V1. As described later, since the first amplifier includes a PMOS transistor and an NMOS transistor, a difference occurs in the output impedance. Therefore, when amplifying and outputting the signal V1, the first amplifier 2 has a tendency to delay the rising of the signal, that is, the waveform of the pulse waveform is broken. Such a rising slope is one factor causing the H-L difference.

The signal V1 is input to the first inverter 3 to be inverted in phase and output as a signal V2. Furthermore, the phase is inverted by being input to the second inverter 4 and is output as a signal V3.

Next, the input signal VIN is input to the second waveform shaping circuit P2 at the same time it input to the first waveform shaping circuit Pl. First, the input signal VIN is input to the third inverter 5 and a signal V4 whose phase is inverted is output. Next, the signal V4 is inverted and differentially amplified by the second amplifier 6 and a signal V5 is output. Furthermore, a signal V6 which is input to the fourth inverter 7 and whose phase is inverted is output.

The output signal V3 and the output signal V6 have inverse characteristics in that the period during which the signal V3 is at the L level is long and the period during which the signal V6 is at the H level is long. In the output signal VOUT output to the output end of FIG. 1B in which these two signals are combined, the L level period and the H level period are equalized and averaged. By this averaging, the H-L difference is eliminated, and the output signal VOUT having a slope at the rising and falling edges of the signal waveform is output.

According to the configuration of the DOUT amplifier as described above, the input signal VIN is branched into two by the first current path and the second current path. The first current path inverts and differentially amplifies the input signal VIN and then inverts the phase to generate a first output signal, and the second current path inverts the phase of the input signal VIN and then inverts and differentially amplifies the input signal VIN to generate a second output signal. By shaping a waveform in which the order of inversion and differential amplification of these input signals and phase inversion is different, the waveform is shaped to have a symmetrical slope at the rising and falling of the waveform of the input signals and is combined at the output side, so that the H-L difference disappears.

According to this embodiment, it is possible to reduce data pattern dependent jitter at the high speed operation according to an increased data rate by reducing the period time difference between the H level and the L level of the output signal from the differential waveform shaping circuit provided in the DOUTAMP in the output circuit of the NAND flash memory which is one of the semiconductor memory devices.

Figure 5A:
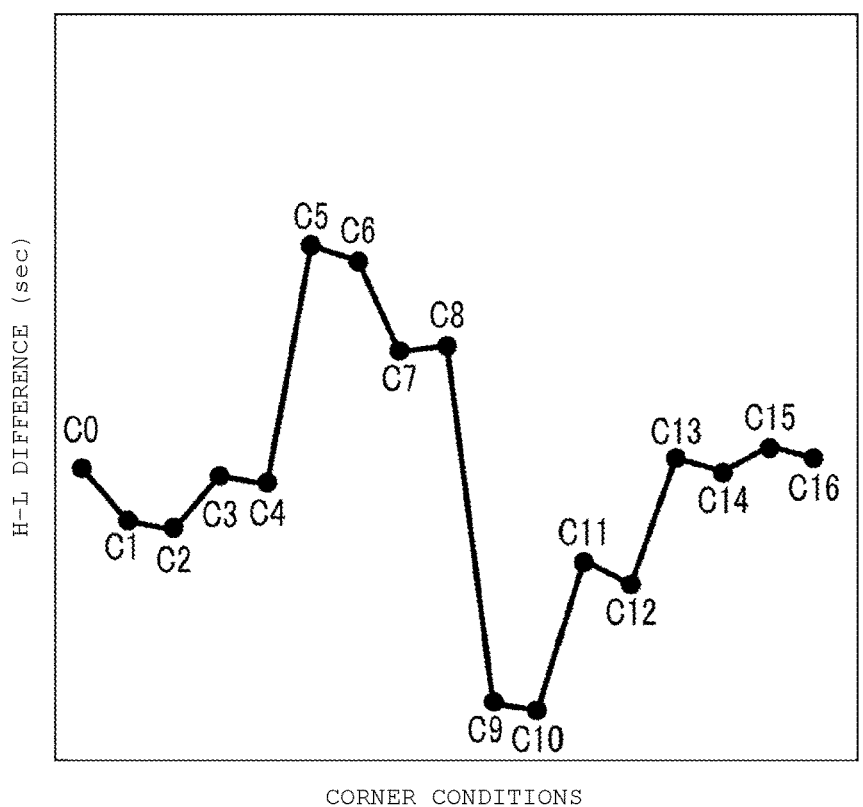
FIG. 5A is a diagram showing an example of an H-L difference of a signal V3 shown in FIG. 1A.
Figure 5B:
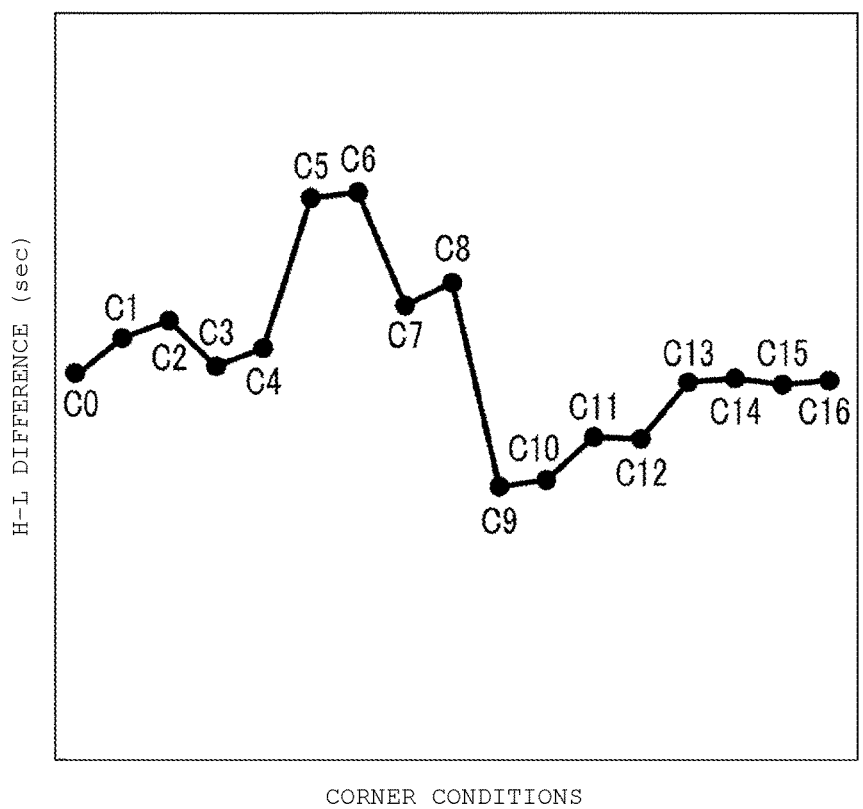
FIG. 5B is a diagram showing an example of an H-L difference of an output signal VOUT shown in FIG. 1B.

In FIGS. 5A and 5B, the horizontal axis represents the corner conditions (the conditions under which the threshold voltage, the power supply voltage, and the temperature of the transistor are varied), and the vertical axis represents the H-L difference (the difference between the H level output period and the L level output period). FIG. 5A shows the H-L difference of the signal V3 shown in FIG. 1A, and FIG. 5B shows the H-L difference of the output signal VOUT shown in FIG. 1B. In FIG. 5A, the output period of the H level is extremely long in corners C5 to C8, and the output period of the L level is extremely long in corners C9 to C12. On the other hand, in FIG. 5B, the signal V3 and the signal V6 having the inverse characteristics are combined, whereby the difference between the corners C5 to C8 and the corners C9 to C12 is reduced and has a robust characteristic that is less susceptible to the effects of transistor threshold voltage, supply voltage, and temperature.

Figure 6:
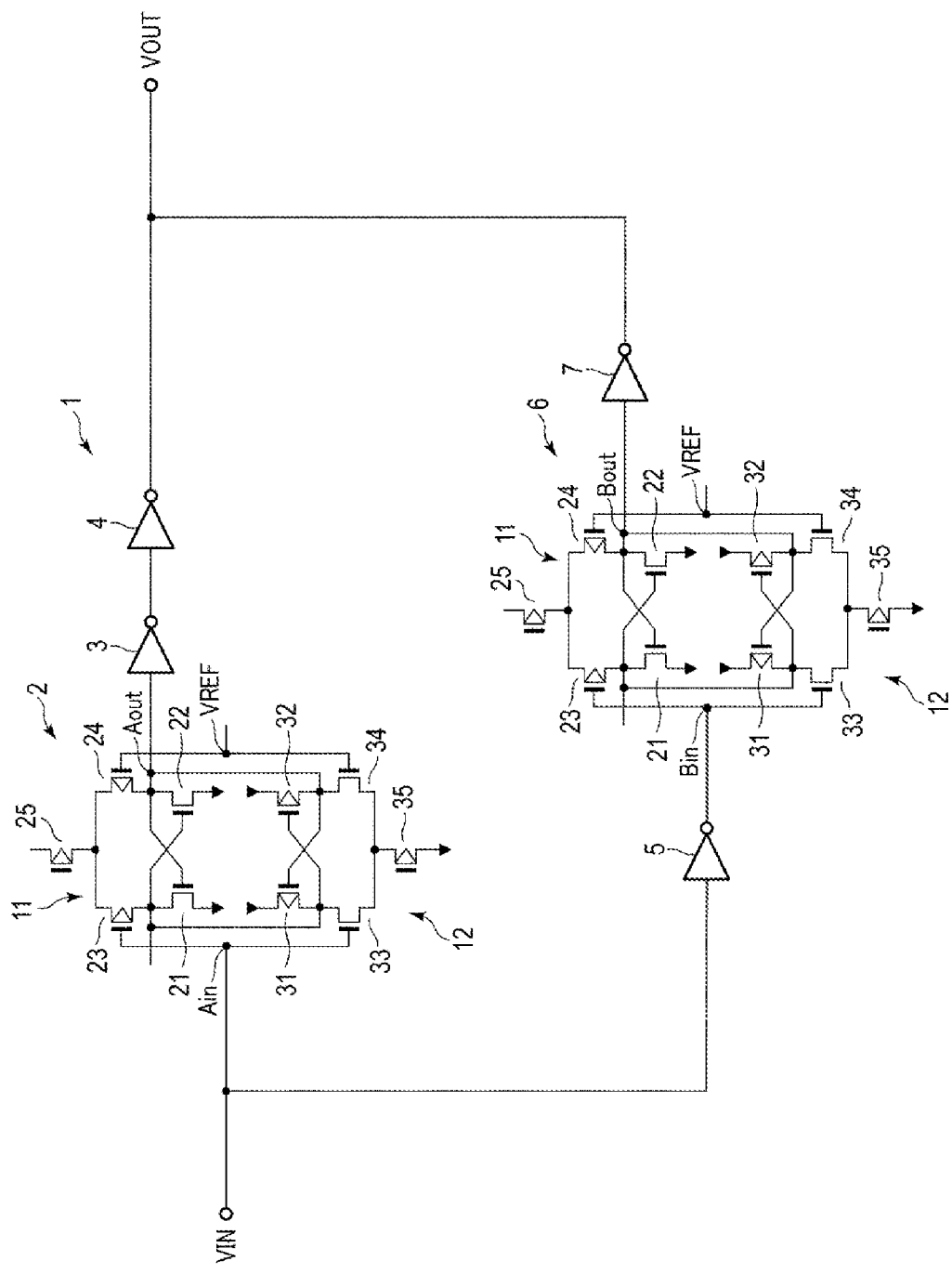
FIG. 6 is a circuit diagram of a cross-coupled load amplifier used as a first amplifier and a second amplifier in the differential waveform shaping circuit.

FIG. 6 shows a configuration in which an example of a cross-coupled load amplifier is incorporated in the first amplifier 2 and the second amplifier 6 of the differential waveform shaping circuit 1. The first amplifier 2 and the second amplifier 6 are both used as an inverting differential amplifier circuit and include a first cross-coupled load amplifier (hereinafter, referred to as a first cross amplifier) 11 and a second cross-coupled load amplifier (hereinafter, referred to as a second cross amplifier) 12. As described above, the first amplifier 2 and the second amplifier 6 have the same input/output characteristics and include the transistors of the same sizes and the same manufacturing parameters, respectively.

In the first cross amplifier 11, an input terminal Ain or Bin and a reference voltage VREF as differential input signals are input to PMOS transistors 23 and 24, and cross-coupled NMOS transistors 21 and 22 are connected as loads. A PMOS transistor 25 of a constant current source is connected between the PMOS transistors 23 and 24 and a reference power supply potential. For the constant current source, a signal for controlling the timing of the output may be applied.

In the second cross amplifier 12, an input terminal Ain or Bin and the reference voltage VREF as differential input signals are input to NMOS transistors 33 and 34, and cross-coupled PMOS transistors 31 and 32 are connected as loads. A signal for controlling the timing of the output may be applied between the NMOS transistors 33 and 34 and a ground reference potential.

In the first amplifier 2, the input terminal Ain is connected to the respective gates of the PMOS transistor 23 and the NMOS transistor 33, the reference voltage VREF is connected to the respective gates of the PMOS transistor 24 and the NMOS transistor 34, and the input signal VIN is simultaneously input to the respective gates. Further, an output end Aout is connected to the output terminal via the first inverters 3 and 4 described above. Similarly, in the second amplifier 6, the input terminal Bin is connected to the respective gates of the PMOS transistor 23 and the NMOS transistor 33, the reference voltage VREF is connected to the respective gates of the PMOS transistor 24 and the NMOS transistor 34, and the input signal VIN is simultaneously input to respective gates via the third inverter 5. Further, an output end Bout is connected to the output terminal via the fourth inverter 7 described above.

Figure 8:
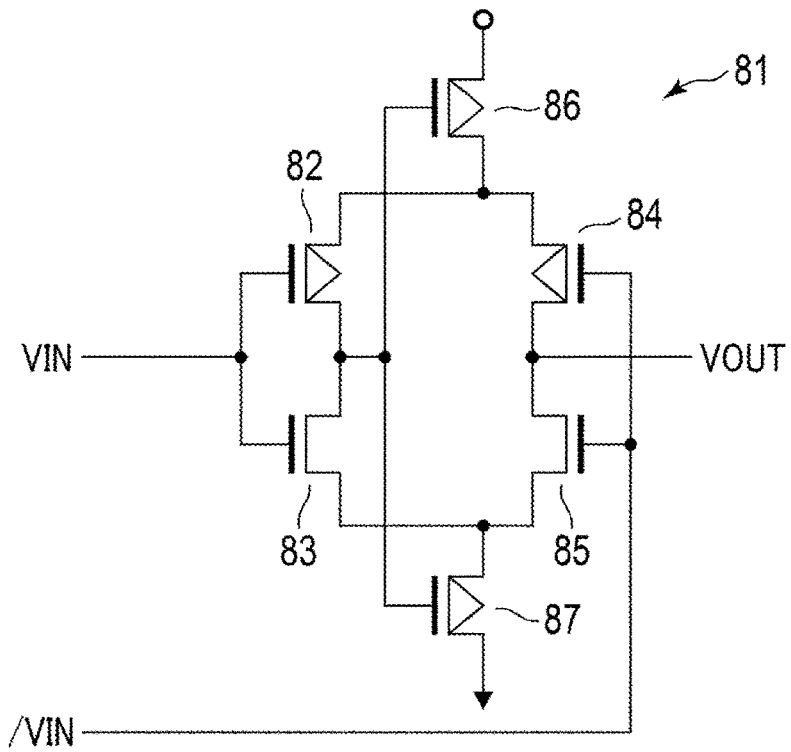
FIG. 8 is a diagram showing an example of a differential amplifier circuit.

FIG. 8 shows an example of a differential amplifier circuit. A differential amplifier circuit 81 is an alternative configuration of the first amplifier 2 and the second amplifier 6 shown in FIG. 6. If the differential amplifier circuit 81 is used as each of the first amplifier 2 and the second amplifier 6, a node of the input signal VIN would correspond to the input node Ain of the first amplifier 2 and the input node Bin of the second amplifier 6, and a node of the output signal VOUT would correspond to the output node Aout of the first amplifier 2 and the output node Bout of the second amplifier 6. In addition, the reference voltage VREF would be supplied to a node of the inverted signal /VIN. In the differential amplifier circuit 81, the first current path by the PMOS transistor 82 and the NMOS transistor 83 and the second current path by the PMOS transistor 84 and the NMOS transistor 85 are disposed to face each other in parallel as in the configuration of a current mirror. The input signal VIN is input to each gate of the PMOS transistor 82 and the NMOS transistor 83. Further, an inverted input signal /VIN obtained by inverting the input signal is input to each gate of the PMOS transistor 84 and the NMOS transistor 85.

Furthermore, in both the PMOS transistors 82 and 84, one end of the current path is connected to one end of the current path of the PMOS transistor 86, and the other end of the current path of the PMOS transistor 86 is connected to the power supply terminal to which the power supply VCCQ is supplied. In the NMOS transistors 83 and 85, one end of the current path is connected to one end of the current path of the PMOS transistor 87, and the other end of the current path of the PMOS transistor 87 is connected to the ground potential (GND terminal). In both the PMOS transistors 86 and 87, a gate is connected to an output end between the drain and source of the PMOS transistor 82 and the NMOS transistor 83 and driven by an output signal. The output end of the differential amplifier circuit 81 is provided between the drain and source of the PMOS transistor 84 and the NMOS transistor 85, and the output signal VOUT is output.

Since the input signal VIN (/VIN) is simultaneously input to the PMOS transistor 82 (84) and the NMOS transistor (85), an H-L difference is very small and the differential amplifier circuit 8 is less susceptible to the influence of the data pattern dependent jitter at the high speed operation.

Figure 9:
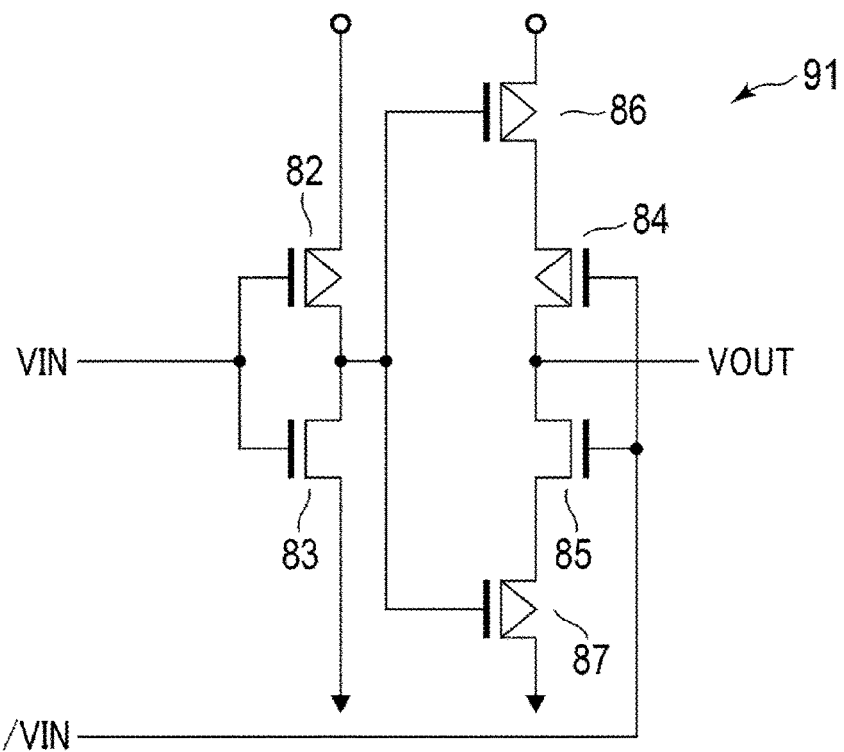
FIG. 9 is a diagram showing a modification example of the differential amplifier circuit.

A differential amplifier circuit 91 shown in FIG. 9 is a modification example of the differential amplifier circuit 81 described above. If the differential amplifier circuit 91 is used as each of the first amplifier 2 and the second amplifier 6, a node of the input signal VIN would correspond to the input node Ain of the first amplifier 2 and the input node Bin of the second amplifier 6, and a node of the output signal VOUT would correspond to the output node Aout of the first amplifier 2 and the output node Bout of the second amplifier 6. In addition, the reference voltage VREF would be supplied to a node of the inverted signal /VIN. The differential amplifier circuit 91 is different from the above-described differential amplifier circuit 81 in that the other end of the current path of the NMOS transistor 83 is directly connected to the ground potential (GND terminal). The other configuration is the same as the circuit configuration of the differential amplifier circuit 81.

Since the input signal VIN (/VIN) is simultaneously input to the PMOS transistor 82 (84) and the NMOS transistor (85), an H-L difference is very small and the differential amplifier circuit 91 is less susceptible to the influence of the data pattern dependent jitter at the high speed operation. In addition, since the NMOS transistor 83 is directly connected to the ground potential, the operation is stabilized.

Next, configuration conditions and a layout in the differential waveform shaping circuit 1 of the present embodiment will be described with reference to FIGS. 10 and 11.

Figure 11:
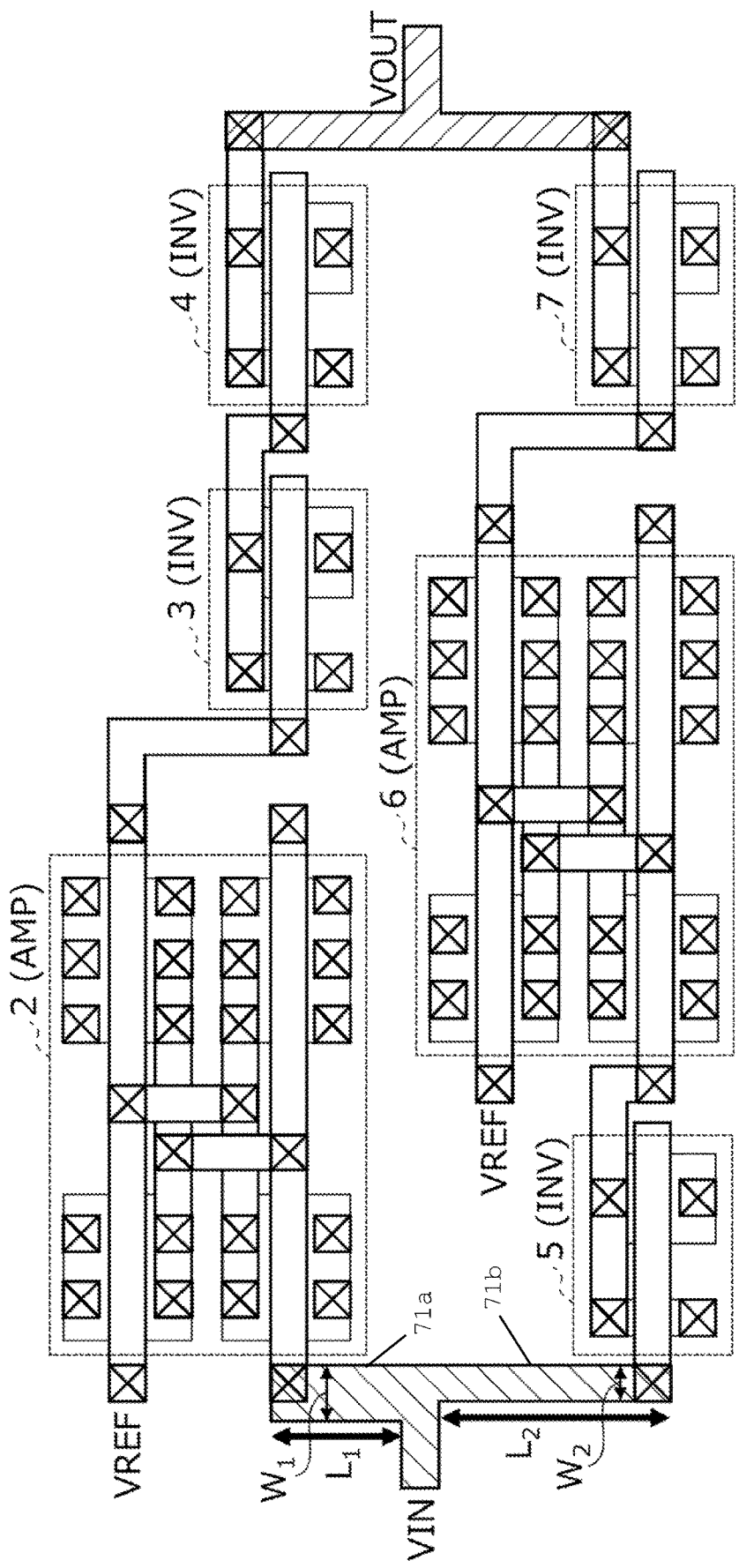
FIG. 11 is a diagram showing an example of a layout of the differential waveform shaping circuit.

FIG. 11 shows the layout of the block configuration of the differential waveform shaping circuit 1 shown in FIG. 1 described above. As the first waveform shaping circuit Pl, the first amplifier 2, the first inverter 3 and the second inverter 4 are disposed in series in this order from the input end VIN. Similarly, as the second waveform shaping circuit P2, the third inverter 5, the second amplifier 6, and the fourth inverter 7 are disposed in series in this order from the input end VIN. Furthermore, wiring connecting each output side of the second inverter 4 and the fourth inverter 7 at one point is disposed.

Figure 10:
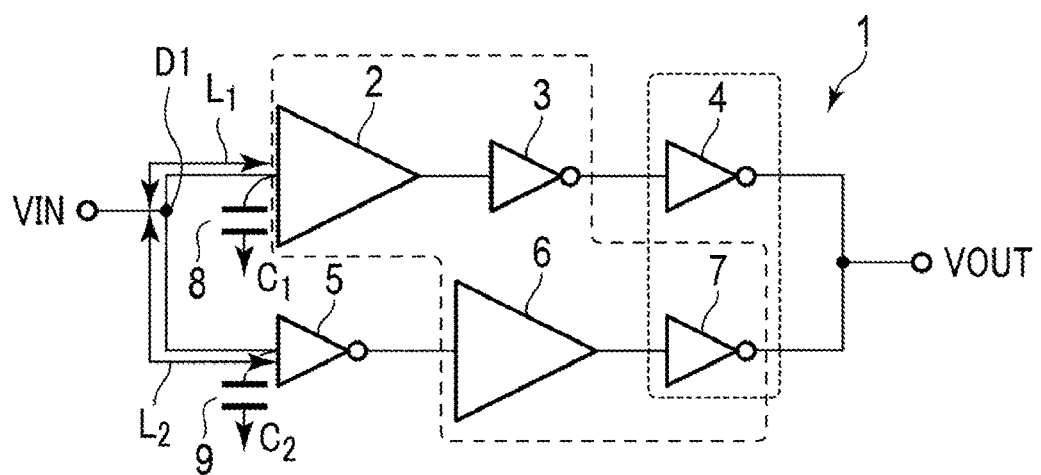
FIG. 10 is a circuit diagram for illustrating configuration conditions in the differential waveform shaping circuit.

As shown in FIG. 10, the differential waveform shaping circuit 1 forms a waveform so that the input signal forms a proper crossing by using two inverting differential amplification circuits (e.g., first amplifier 2 and second amplifier 6) connected in parallel, and a plurality of phase inverting circuits connected to each inverting differential amplifier circuit. In order to form a waveform so that this input signal forms a proper crossing, configuration conditions are defined.

1) In the set including the first amplifier 2 and the first inverter 3, and the set including the second amplifier 6 and the fourth inverter 7, the layout of circuit elements formed on the semiconductor chip is the same in order to give the same input/output characteristics.

2) As for the width of the wiring pattern, a wiring pattern 71a has a width W1, and a wiring pattern 71b has a width W2. In the following example, the wiring patterns 71a and 71b have widths W1=W2 and have the same wiring cross-sectional area (width W×thickness T). At this time, a distance L1 (resistance value R1) of the wiring pattern from a branch point D1 to the input end of the first amplifier 2 is set. Further, a distance L2 (resistance value R2) of the wiring pattern from the branch point D1 to the third inverter 5 is set. The capacitance of the wiring pattern 71a from the branch point D1 to the input end of the first amplifier 2 is C1, and the capacitance of the wiring pattern 71b from the branch point D1 to the input end of the third inverter 5 is C2. It is essential that the relationship between a first time constant (R1×C1) of the wiring pattern 71a and a second time constant (R2×C2) of the wiring pattern 71b be the same time constant R1×C1=R2×C2. In practice, in the case of forming a wiring pattern on a chip, in many cases, wiring patterns with the same cross-sectional area are formed in a circuit, and the ratio of resistance values can be defined only by the distances L1 and L2 without considering the cross-sectional area.

However, the capacitance C1 may include both the parasitic capacitance generated by the wiring 71a and the input capacitance of the amplifier depending on the wiring that is drawn out based on the design and specifications and on the positional relationship between the circuit elements, and the capacitance C2 may also include both the parasitic capacitance generated by the wiring 71b and the input capacitance of the amplifier. Therefore, the wiring patterns 71a and 71b are not necessarily limited to the width W1=W2. For example, as shown in FIG. 11, in a case where the width W1 of the wiring 71a is increased, it is also necessary to increase the distance L1 to keep the time constant constant. In the example shown in FIG. 11, since the size of the input transistor of the first amplifier 2 is larger than that of the third inverter 5, the capacitance C1>the capacitance C2. For this reason, the width of the wiring pattern is set as width W1>width W2, and the distance between the wiring patterns is set as distance L1<distance L2.

3) The second inverter 4 and the fourth inverter 7 have the same size, are formed according to the same manufacturing parameters, and have the same input/output characteristics.

4) The third time constant of the wiring pattern from the second inverter 4 to the output end and the fourth time constant of the wiring pattern from the fourth inverter 7 to the output end are the same time constant (R×C). If the wiring patterns have the same wiring cross-sectional area (width W×thickness T), the distances of the wiring patterns are the same.

Figure 12:
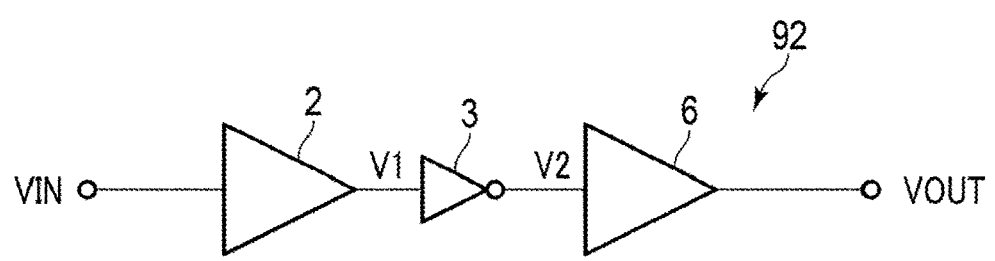
FIG. 12 is a simplified circuit diagram of a differential waveform shaping circuit according to a second embodiment.
Figure 13:
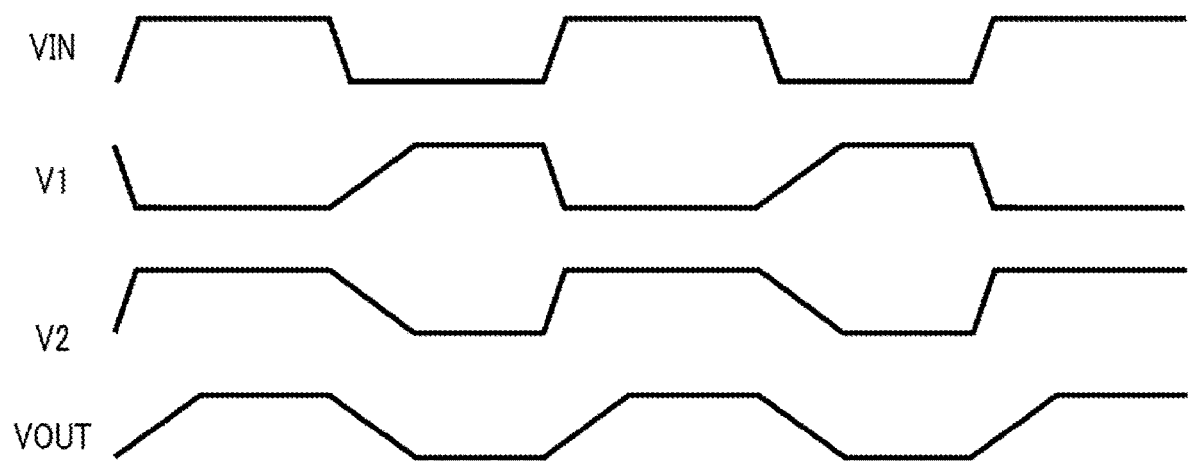
FIG. 13 is a diagram showing an example of the output signal VOUT measured by the differential waveform shaping circuit shown in FIG. 12.

Next, a configuration example of a differential waveform shaping circuit to be used for the DOUT amplifier according to a second embodiment will be described with reference to FIGS. 12 and 13. The same components as those of the first embodiment described above in the components of the present embodiment are denoted by the same reference numerals, and the description thereof is omitted. A differential waveform shaping circuit 92 according to the present embodiment includes serially connecting the first amplifier 2, the first inverter 3, and the second amplifier 6 described above. The first amplifier 2 and the second amplifier 6 are inverting differential amplifier circuits and have the same input/output characteristics. Of course, as the first amplifier 2 and the second amplifier 6, the above-described cross-coupled load amplifier can be used. The differential waveform shaping circuit 92 has a simplified configuration by giving the same function to the differential waveform shaping circuit 1 in the first embodiment described above.

The waveform shaping by the differential waveform shaping circuit 92 will be described. First, as shown in FIG. 13, when the input signal VIN is input to the first amplifier 2, the input signal VIN is inverted and differentially amplified, and the signal V1 is output. At this time, when the first amplifier 2 amplifies and outputs the signal V1, the rising of the signal is delayed, and the waveform of the pulse waveform is broken.

Furthermore, the signal V1 is input to the first inverter 3 to be inverted in phase and output as the signal V2. Due to this inversion, in the signal V2, the slope generated at the rising of the signal due to the delayed rising of the first amplifier 2 becomes the slop at which the falling is delayed due to the inversion. Next, the signal V2 is inverted and differentially amplified by the second amplifier 6 to form the waveform of an output signal VOUT. By the inversion and differential amplification by the second amplifier 6, the output signal VOUT having the same slope at the rising and the falling edges of the waveform of the signal V2 is output.

As described above, since the differential waveform shaping circuit 92 of the present embodiment includes the first amplifier 2 and the second amplifier 6 consisting of two inverting differential amplifier circuits, and the one first inverter 3, the waveform shaping can be achieved with a compact and simple configuration compared to the first embodiment. Further, the configuration is such that there is no parallel current path, and adjustment of the time constant with respect to the wiring pattern is unnecessary, and therefore, the layout is easy. The differential waveform shaping circuit 92 according to the present embodiment can reduce power consumption and heat generation because the number of circuit elements is small.

In addition, with respect to the differential waveform shaping circuit of the first embodiment and the second embodiment described above, it is also possible to adjust the duty ratio of the waveform to be formed by performing feedback control using the performance information acquired by using the ZQ calibration circuit 111 and the Ron conversion logic circuit 142 described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a differential waveform shaping circuit including
        a first waveform shaping circuit having a first inverting amplifier, a first inverter, and a second inverter connected in series, wherein the first inverting amplifier is configured to invert and differentially amplify an input signal having a rectangular waveform, the first inverter is configured to invert a phase of a first signal output from the first inverting amplifier, and the second inverter is configured to invert a second signal output from the first inverter and output the inverted second signal, and
        a second waveform shaping circuit having a third inverter, a second inverting amplifier, and a fourth inverter connected in series, wherein the third inverter is configured to invert a phase of the input signal, the second inverting amplifier is configured to invert and differentially amplify a third signal output from the third inverter, and the fourth inverter is configured to invert the phase of a fourth signal output from the second inverting amplifier and output the inverted fourth signal,
    wherein the first waveform shaping circuit and the second waveform shaping circuit are connected in parallel, and the differential waveform shaping circuit is configured to generate an output signal by averaging the inverted second signal output by the first waveform shaping circuit and the inverted fourth signal output by the second waveform shaping circuit.

2. The semiconductor memory device according to claim 1, wherein
    by averaging the inverted second signal output by the first waveform shaping circuit and the inverted fourth signal output by the second waveform shaping circuit, a slope of a waveform generated due to delayed rising of a waveform at the time of amplification by the first inverting amplifier, and a slope of a waveform generated due to delayed falling of a waveform at the time of amplification by the second inverting amplifier have substantially the same magnitudes.

3. The semiconductor memory device according to claim 1, wherein the first inverting amplifier and the second inverting amplifier have substantially the same input/output characteristics.

4. The semiconductor memory device according to claim 3, wherein each of the first and second inverting amplifiers
    include a first cross-coupled load amplifier in which NMOS transistors are cross-coupled, and a second cross-coupled load amplifier in which PMOS transistors are cross-coupled, and
    form an inverting differential amplification circuit in which the input signal is input to the first cross-coupled load amplifier and the second cross-coupled load amplifier.

5. The semiconductor memory device according to claim 4, wherein
    a first set including the first inverting amplifier and the first inverter, and a second set including the third inverter and the second inverting amplifier are formed on a chip and have the same size and have the same input/output characteristics.

6. The semiconductor memory device according to claim 5, wherein
    a first time constant of a first wiring pattern from an input terminal to which the input signal is supplied to an input end of the first inverting amplifier of the first waveform shaping circuit is the same as a second time constant of a second wiring pattern from the input terminal to an input end of the third inverter of the second waveform shaping circuit.

7. The semiconductor memory device according to claim 6, wherein the first wiring pattern has a first length and a first width, and the second wiring pattern has a second length that is longer than the first length and a second width that is narrower than the first width.

8. The semiconductor memory device according to claim 6, wherein
a third time constant of a wiring pattern from the second inverter to an output end of the differential waveform shaping circuit is the same as a fourth time constant of a wiring pattern from the fourth inverter to the output end.

9. The semiconductor memory device according to claim 1, further comprising:
an input/output circuit including a plurality of input circuits and a plurality of output circuits,
wherein the differential waveform shaping circuit is provided in each of the output circuits.

10. A semiconductor memory device comprising:
an input/output circuit including a plurality of input circuits and a plurality of output circuits, wherein each of the output circuits includes a differential waveform shaping circuit, and the differential waveform shaping circuit includes:
a first waveform shaping circuit having a first inverting amplifier, a first inverter, and a second inverter connected in series, wherein the first inverting amplifier is configured to invert and differentially amplify an input signal having a rectangular waveform, the first inverter is configured to invert a phase of a first signal output from the first inverting amplifier, and the second inverter is configured to invert a second signal output from the first inverter and output the inverted second signal, and
a second waveform shaping circuit having a third inverter, a second inverting amplifier, and a fourth inverter connected in series, wherein the third inverter is configured to invert a phase of the input signal, the second inverting amplifier is configured to invert and differentially amplify a third signal output from the third inverter, and the fourth inverter is configured to invert the phase of a fourth signal output from the second inverting amplifier and output the inverted fourth signal,
wherein the first waveform shaping circuit and the second waveform shaping circuit are connected in parallel, and the differential waveform shaping circuit is configured to generate an output signal by averaging the inverted second signal output by the first waveform shaping circuit and the inverted fourth signal output by the second waveform shaping circuit.

11. The semiconductor memory device according to claim 10, wherein
a first time constant of a first wiring pattern from an input terminal to which the input signal is supplied to an input end of the first inverting amplifier of the first waveform shaping circuit is the same as a second time constant of a second wiring pattern from the input terminal to an input end of the third inverter of the second waveform shaping circuit.

12. The semiconductor memory device according to claim 11, wherein the first wiring pattern has a first length and a first width, and the second wiring pattern has a second length that is longer than the first length and a second width that is narrower than the first width.

13. The semiconductor memory device according to claim 11, wherein a third time constant of a wiring pattern from the second inverter to an output end of the differential waveform shaping circuit is the same as a fourth time constant of a wiring pattern from the fourth inverter to the output end.

14. The semiconductor memory device according to claim 10, wherein
by averaging the inverted second signal output by the first waveform shaping circuit and the inverted fourth signal output by the second waveform shaping circuit, a slope of a waveform generated due to delayed rising of a waveform at the time of amplification by the first inverting amplifier, and a slope of a waveform generated due to delayed falling of a waveform at the time of amplification by the second inverting amplifier have substantially the same magnitudes.

15. The semiconductor memory device according to claim 10, wherein the first inverting amplifier and the second inverting amplifier have substantially the same input/output characteristics.

16. The semiconductor memory device according to claim 15, wherein each of the first and second inverting amplifiers include a first cross-coupled load amplifier in which NMOS transistors are cross-coupled, and a second cross-coupled load amplifier in which PMOS transistors are cross-coupled, and
form an inverting differential amplification circuit in which the input signal is input to the first cross-coupled load amplifier and the second cross-coupled load amplifier.

17. The semiconductor memory device according to claim 16,
wherein a first set including the first inverting amplifier and the first inverter, and a second set including the third inverter and the second inverting amplifier are formed on a chip and have the same size and have the same input/output characteristics.

18. A method of shaping a waveform in a semiconductor memory device, said method comprising:
inverting and differentially amplifying an input signal having a rectangular waveform, with a first inverting amplifier, to generate a first signal;
inverting a phase of the first signal to generate a second signal;
inverting the second signal to generate a third signal;
inverting a phase of the input signal to generate a fourth signal;
inverting and differentially amplifying the fourth signal, with a second inverting amplifier, to generate a fifth signal;
inverting the phase of the fifth signal to generate a sixth signal; and
outputting an average of the third signal and the sixth signal.

19. The method according to claim 18, wherein
by averaging the third signal and the sixth signal, a slope of a waveform generated due to delayed rising of a waveform at the time of amplification by the first inverting amplifier, and a slope of a waveform generated due to delayed falling of a waveform at the time of amplification by the second inverting amplifier have substantially the same magnitudes.

20. The method according to claim 18, wherein the first inverting amplifier and the second inverting amplifier have substantially the same input/output characteristics.

* * * * *